US006372530B1

(12) United States Patent
Lee

(10) Patent No.: US 6,372,530 B1
(45) **Date of Patent: *Apr. 16, 2002**

(54) METHOD OF MANUFACTURING A COLD-CATHODE EMITTER TRANSISTOR DEVICE

(75) Inventor: John K. Lee, Meridian, ID (US)

(73) Assignee: Micron Technology, Inc., Boise, ID (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/116,828

(22) Filed: Jul. 16, 1998

Related U.S. Application Data

(62) Division of application No. 08/554,551, filed on Nov. 6, 1995, now abandoned.

(51) Int. Cl.[7] .................................... H01L 21/00
(52) U.S. Cl. .................................... 438/20; 438/294
(58) Field of Search .................................... 438/20, 22, 23, 438/238, 294; 445/24

(56) References Cited

U.S. PATENT DOCUMENTS

| | | | | |
|---|---|---|---|---|
| 3,970,887 A | | 7/1976 | Smith et al. | 313/309 |
| 5,151,061 A | | 9/1992 | Sandhu | 445/24 |
| 5,186,670 A | | 2/1993 | Doan et al. | 445/24 |
| 5,210,472 A | | 5/1993 | Casper et al. | |
| 5,229,331 A | | 7/1993 | Doan et al. | 438/20 |
| 5,318,918 A | * | 6/1994 | Frazier | |
| 5,359,256 A | * | 10/1994 | Gray | |
| 5,391,259 A | | 2/1995 | Cathey et al. | 438/20 |
| 5,572,041 A | | 11/1996 | Betsui et al. | 257/10 |
| 5,606,215 A | | 2/1997 | Jaskie et al. | |
| 5,683,282 A | | 11/1997 | Liu et al. | |
| 5,710,478 A | * | 1/1998 | Kanemaru et al. | |
| 5,754,009 A | | 5/1998 | Hayes | |
| 5,814,858 A | | 9/1998 | Williams | |
| 5,872,019 A | * | 2/1999 | Lee et al. | 438/20 |

FOREIGN PATENT DOCUMENTS

| | | | |
|---|---|---|---|
| JP | 6176686 | * | 6/1994 |

OTHER PUBLICATIONS

Pierret, Modular Series on Solid State Devices: Field Effect Devices, 1983, Addison–Wesley Publishing, vol. IV, p. 82.*
Gray and Mayer, "Analysis and Design of Analog Integrated Circuits",3rd Edition, John Wiley & Sons, Inc., pp. 149–153, 1993.*
J. Millman and C. Halkias, "Integrated Electronics: Analog and Digital Circuits and Systems," 1972, pp. 322–329.

* cited by examiner

*Primary Examiner*—Tuan H. Nguyen
*Assistant Examiner*—Evan Pert
(74) *Attorney, Agent, or Firm*—Dorsey & Whitney LLP

(57) ABSTRACT

A cold-cathode emitter includes a high-voltage tank of a second conductivity that is formed in a substrate having a fast conductivity. An emitter tip is integral with the tank and extends outwardly from the substrate. The tank forms either a drain region or a collector region of a transistor. A cold-cathode emitter device includes a drive transistor formed in a substrate of a s conductivity. The transistor includes an electron receive region of a second conductivity. An emitter tip is integral with the electron receive region and extends outwardly from the substrate.

19 Claims, 3 Drawing Sheets

METHOD OF MANUFACTURING A COLD-CATHODE EMITTER TRANSISTOR DEVICE

CROSS-REFERENCE TO RELATED APPLICATION

This application is a divisional of U.S. patent application Ser. No. 08/554,551, filed Nov. 6, 1995 now abandoned.

TECHNICAL FIELD

The present invention relates generally to semiconductor devices and, more specifically, to a cold-cathode device for emitting electrons in a field emission display and a method for forming the cold-cathode device.

BACKGROUND OF THE INVENTION

A field emission display (FED) is a type of flat panel display that engineers have developed to replace the cathode ray tube (CRT) display. Typically, an FED includes a plurality of cathode emitter tips that can emit electrons while "cold," i.e., not heated like the cathode coil of a CRT. These electrons collide with a cathodoluminescent material that coats the inner surface of a display screen. The electrons from each tip collide with the screen at a corresponding location or point. Each collision point forms all or part of a picture element, i.e., pixel, of a displayed image. The greater the collision rate at a particular pixel, the brighter the pixel appears. Likewise, the lower the collision rate, the dimmer the pixel appears. A screen that displays the image in color typically includes one pixel for each component color.

An active matrix FED, which has been described in the literature, includes a drive transistor that is formed as part of the FED. Thus, the active matrix provides faster pixel signal response times and more precise brightness and color control as opposed to passive matrix FEDs, which are driven by off-FED drive transistors.

Each cathode emitter tip of an active matrix FED is typically coupled to the electron receiving region of a drive transistor. That is, the tip is coupled to either the drain of a field effect transistor or the collector of a bipolar transistor. Often, the tip is formed directly on the electron receiving region. When the transistor is activated, i.e., turned on, electrons flow through the transistor and out of the tip toward the display screen. The greater the electron flow, i.e., current, through the tip, the greater the electron collision rate at the pixel associated with the tip, and thus the brighter the pixel.

Because it is physically disposed between the drive transistor and the display screen, the emitter tip typically is formed after the drive transistor. Forming the tip after forming the drive transistor may increase the complexity of the FED manufacturing process. Furthermore, the coupling between the tip and the electron receiving region of the drive transistor may weaken over time, and thus reduce the lifetime of the tip, i.e., the time during which the tip can effectively emit electrons.

SUMMARY OF THE INVENTION

In accordance with one aspect of the present invention, a cold-cathode emitter is provided. The cold-cathode emitter includes a high-voltage tank of a second conductivity that is formed in a substrate having a first conductivity. An emitter tip is integral with the tank and extends outwardly from the substrate. In a related aspect of the invention, the tip has a conical shape. In another related aspect of the invention, the tank forms either a drain region or a collector region of a transistor.

In accordance with another aspect of the present invention, a cold-cathode emitter device is provided. The device includes a drive transistor formed in a substrate of a first conductivity. The transistor includes an electron receive region of a second conductivity. An emitter tip is integral with the electron receive region and extends outwardly from the substrate. In a related aspect of the invention, the electron receive region forms a high-voltage tank. In another related aspect of the invention, the tip has a conical shape. In yet another related aspect of the invention, the transistor includes a source and a channel that is interposed between the electron receive region, which forms a drain of the transistor, and the source. Or, the transistor includes a transistor emitter and a transistor base that is interposed between the electron receive region, which forms a collector of the transistor, and the transistor emitter.

An advantage of the present invention is that the drive transistor and the emitter tip may be formed during the same process. Another advantage of the invention is that the emitter tip is integral with the electron receiving region of the drive transistor.

Still another advantage of the invention is that it takes advantage of the active matrix scheme, which provides a faster signal response at the emitter tip.

DETAILED DESCRIPTION OF THE INVENTION

Figure 1:
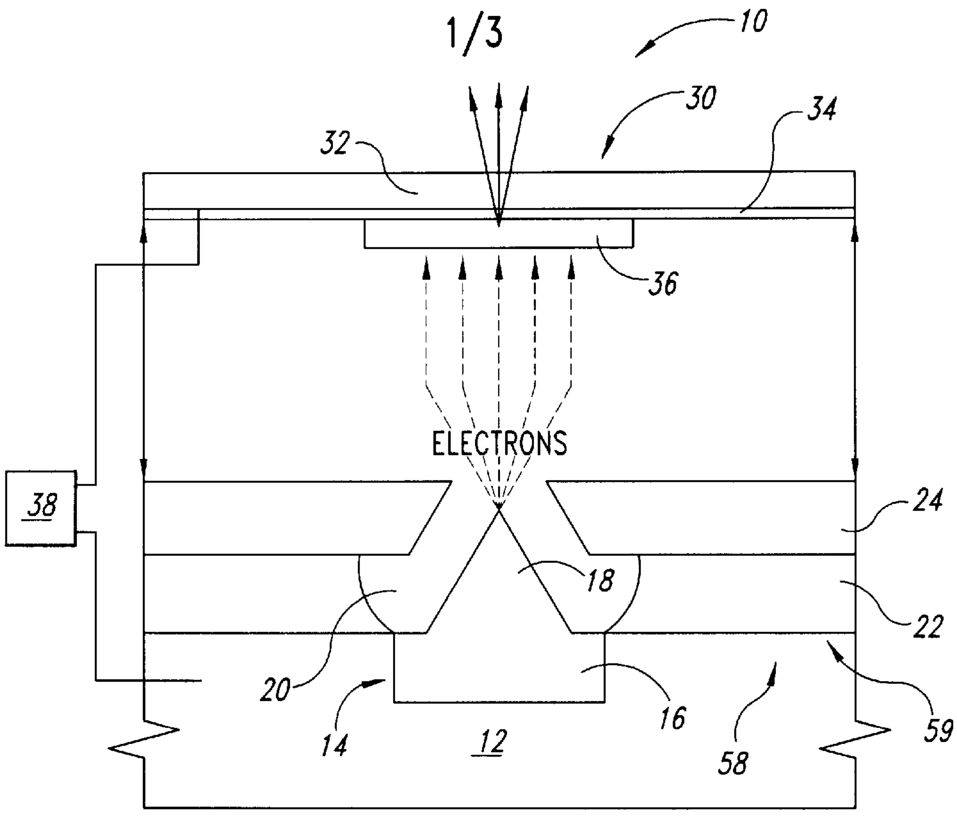
FIG. 1 is a cross section of a portion of a field emission display (FED) according to the present invention.
Figure 5:
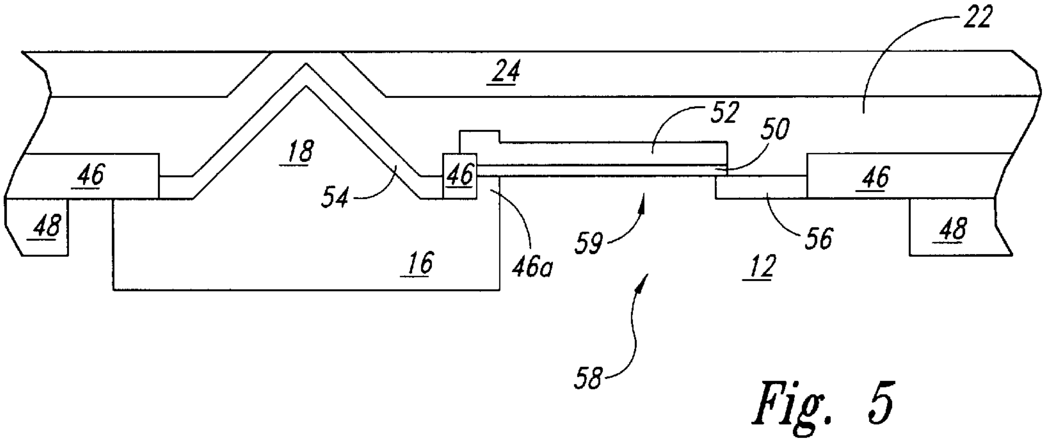
FIG. 5 illustrates the emitter structure of FIG. 4 after the formation of the multi-level insulator and grid layers, and the chemical mechanical planarization of the grid layer.
Figure 6:
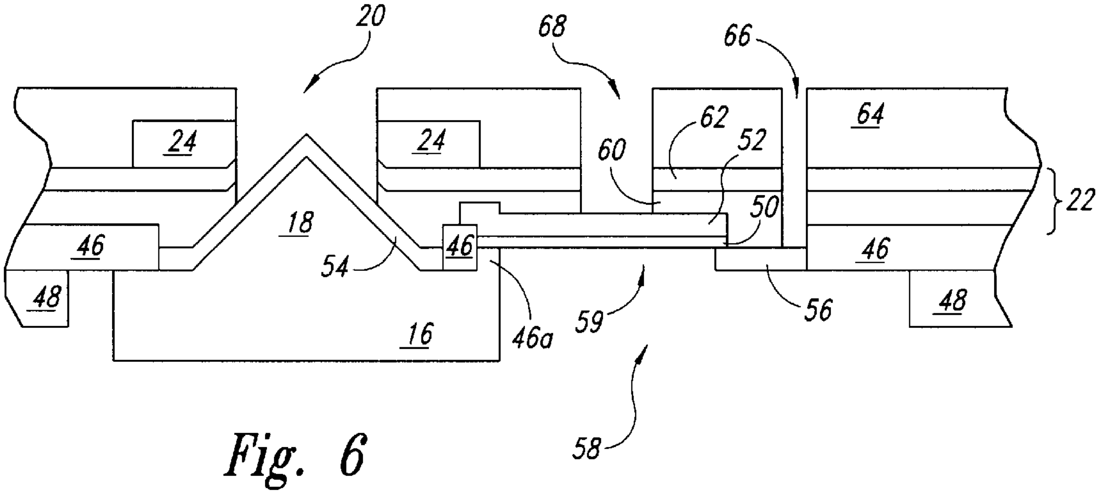
FIG. 6 illustrates the emitter structure of FIG. 5 after the formation of a grid insulating layer, the emitter cavity, and the contact openings.

FIG. 1 is a cross-sectional view of a field emission display (FED) 10 formed in accordance with the present invention. The FED 10 includes a p-type silicon substrate 12. An electron emitter 14, which includes a base 16 and one or more tips 18, is formed in the substrate 12. Multiple tips 18 are typically provided to insure a pixel will be functional if one or more of the tips 18 are defective. Because the total electron flow per pixel is maintained at a substantially constant level, a change in the number of associated tips 18 has little or no effect on the brightness of the pixel. For clarity, only one tip 18 per pixel is discussed below. Typically, the base 16 forms the electron receiving region of a drive transistor such as transistor 58 (FIG. 6). In one aspect of the invention, the base 16 is a high-voltage n tank that forms the drain of the high-voltage emitter-tip drive transistor 58, which includes a gate insulator 50, a gate 52, a channel region 59, and a source 56 (FIG. 5). The tips 18 are sometimes referred to as a conical micro-cathode.

As shown, the tip 18 of the FED 10 is surrounded by a cavity 20, which is formed in an insulator 22 and an overlying grid 24. A display screen 30 includes a glass layer 32 having on its inner surface a transparent and conductive Indium Tin Oxide (ITO) layer or anode 34, and a coating 36 of one or more phosphors. A voltage source 38 biases the grid 24 at a first positive voltage with respect to the substrate 12 and biases the anode 34 at a second positive voltage that is higher than the first positive voltage applied to the grid 24. In one aspect of the invention, the grid 24 is biased to 30–110 volts and the anode 34 is biased to 1 kv–2 kv volts with respect to the substrate 12.

As shown, the emitter tip 18 is formed from the same material as and is thus integral with the base 16. Such a structure reduces the complexity of the FED 10 formation process, and increases the lifetime of the tip 18 because there is no intermediate coupling medium required between the tip 18 and the base 16.

In operation, the drive transistor 58 turns on to allow a current to flow from the tip 18 through the base 16 to the source 56. As this current flows, electrons are emitted from the tip 18. The voltage applied to the anode 34 accelerates these electrons towards the phosphors 36. As the electrons strike the atoms of the phosphors, these atoms emit light to form all or part of a pixel of the image that is displayed on the screen 30. For a color screen 30, the phosphors 36 are typically arranged to emit the appropriate combinations of colored light so as to create a color display image. For example, in one aspect of the invention, each pixel is designated either red, green, or blue.

The structure and operation of FEDs are further discussed in U.S. Pat. No. 5,186,670, which issued to Doan et al. on Feb. 16, 1993 and is incorporated by reference herein.

Figure 2:
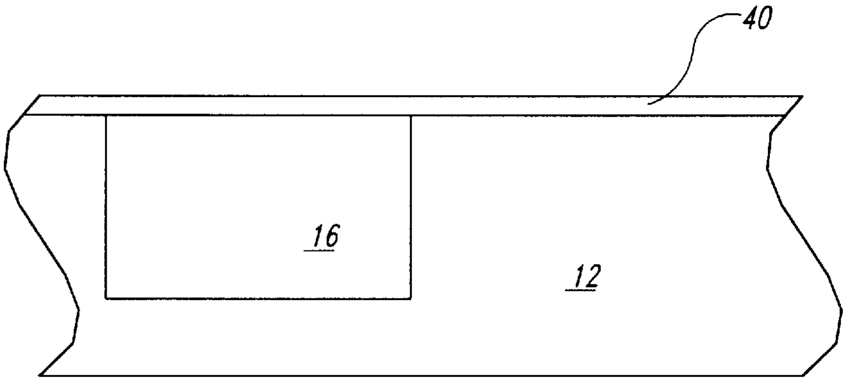
FIG. 2 is a cross-sectional view illustrating the emitter structure of FIG. 1 before the formation of the emitter tip.

Referring to FIGS. 2–6, a method is described for forming the electron emitter 14 and the associated structures of the FED 10. Referring to FIG. 2, the base 16, which in this embodiment is a high-voltage n tank, is formed in the p-type substrate 12. The high voltage tank has a width along the generally planar substrate surface which is predetermined by masking techniques well known in the art. In one aspect of the invention, using photolithography, a photo-pattern (not shown) is formed over the substrate 12. Phosphorous is then implanted through the mask pattern at a dosage of approximately $2\times10^{12}/cm^{2-}5\times10^{12}/cm^2$. The phosphorous is then further driven into the substrate 12 for approximately 5 to 7 hours at a temperature of approximately 1100° C. to 1150° C. to form the tank 16. A layer of silicon dioxide 40 is formed over the substrate 12 as a byproduct of the drive-in step. Because the base 16 is a high voltage tank region, the tank/substrate junction can withstand the voltages imparted to the grid 24 without breaking down.

Figure 3:
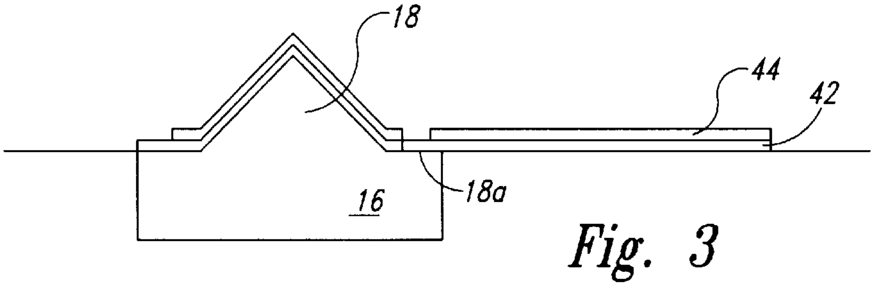
FIG. 3 illustrates the emitter structure of FIG. 2 after the formation of the emitter tip.

Referring to FIG. 3, a tip mask (not shown) is then formed over the n tank 16. The unmasked areas of the oxide layer 40, the substrate 12, and the n tank 16 are then etched to form the tip 18. Subsequent to the etching process, a generally tapered emitter tip is formed, with a maximal emitter tip width occuring where the tip 18 joins the high voltage tank 16. Since the high voltage tank has a greater width than the maximum emitter tip width, generally planar lands are formed from the high voltage tank which are adjacent to the base of the emitter tip 18 where it joins the high voltage tank 16. In one aspect of the invention, a plasma source dry etch that combines isotropic and anisotropic etching techniques is used to form the tip 18. Wet etching may be used as well. For a dry etch process, a fluorine base plasma source may be used. Furthermore, the base plasma may be combined with chlorine chemistry to optimize the etching ratio in a conventional manner.

Still referring to FIG. 3, a pad oxide layer 42 and a nitride layer 44 are formed over the substrate 12, the base 16, and the tip 18. The nitride layer 44 is then etched such that after the etching, the layers 42 and 44 approximately cover only the areas that will become the active areas of the FED 10.

Figure 4:
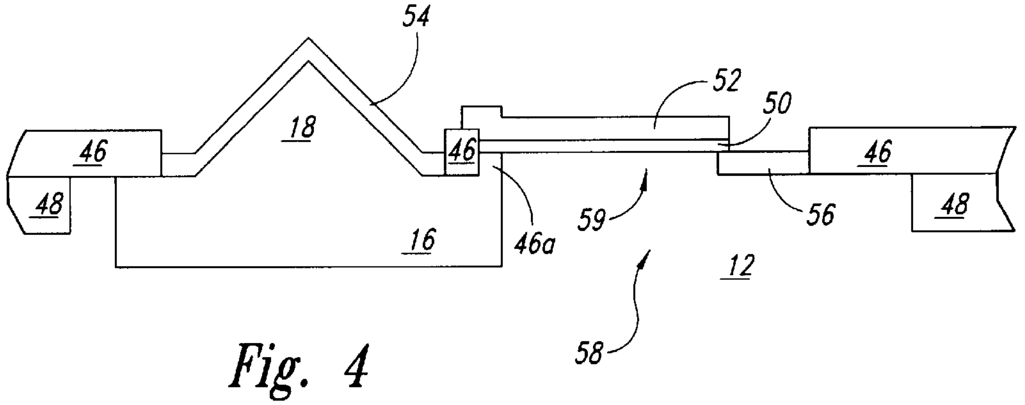
FIG. 4 illustrates the emitter structure of FIG. 3 after the formation of the field oxide, gate insulator, and gate.

Referring to FIG. 4, using the well-known LOCOS process, field oxide 46 is then grown in the areas of the substrate 12 and the n tank 16 in which the nitride layer 44 has been removed. The field oxide 46 grown in a planar land of high voltage n tank 16 allows a portion of the n tank 16 to adjoin the field oxide 16 and the substrate 12, the step structure **46*a*, as shown in FIG.4 A photoresist mask (not shown) is formed over the active areas, and boron is implanted through the field oxide 46 to form p-type isolation regions 48. In one aspect of the invention, the boron is implanted at a dosage of approximately $1\times10^{14}/cm^2 14$ $1\times10^{15}/cm^2$. In another aspect of the invention, the isolation regions 48 may be formed before the field oxide 46** is formed.

Still referring to FIG. 4, after the isolation photoresist mask is stripped, the nitride layer at 44 and the pad oxide layer 42 are removed from the active areas. Next, the gate insulator 50, which in one embodiment of the invention is formed from silicon dioxide, is formed as shown. A polysilicon gate 52 is then formed on the gate insulator 50. The tip 18 and the gate 52 are then doped n+. This doping forms a layer 54 along the outer surfaces of the tip 18. During this implantation step, the source 56 of the high-voltage drive transistor 58 is also formed. Also formed during this step are the source and drain of the low-voltage selection transistor 72 (FIG. 7), which is serially coupled to the source 56 of the high-voltage drive transistor 58. In one aspect of the invention, arsenic or phosphorous is implanted at a dosage of approximately $6\times10^{15}/cm^2$–$9.9\times10^{15}/cm^2$ to dope gate 52 and to form layer 54, source 56, and the sources and drains of the low voltage selection transistors 72. The dopant is then driven in using any of a number of well-known steps. In one aspect of the invention, the arsenic is driven in for ½ hour at approximately 900° C.–950° C. As a result of this doping, a channel 59 is formed between the source 56 and the tank 16.

Referring to FIG. 5, the insulator 22 is then formed on the exposed portions of the substrate 12, gate 52, source 56, tip 18, and field oxide 46. In one aspect of the invention, the insulator layer 22 is a deposited $SiO_2$ layer. In another aspect of the invention, the insulator layer 22 may include multiple layers of different insulator materials, such as boron phosphate silicon glass (BPSG).

Still referring to FIG. 5, the electrically conductive grid layer 24 is then formed on the layer 22. In one aspect of the invention, the grid layer 24 is formed from polysilicon. The grid layer 24 is then subjected to chemical mechanical planarization (CMP) to expose a portion of the insulator layer 22 that is aligned with the tip 18. Next the grid layer 24 is doped. In one embodiment of the invention, the polysilicon grid layer 24 is implanted with phosphorous at a dosage of approximately $6\times10^{15}/cm^2$–$9.9\times10^{15}/cm^2$. This dopant is then driven in for approximately 10–20 minutes at a temperature of approximately 850° C.–900° C.

Referring to FIG. 6, the grid layer 24 is photoetched to form the grid 24. A second insulating layer 64 is then formed on the exposed portions of the grid 24 and the first insulating layer 22. The layer 64 may have a multilevel oxide structure, or may have another suitable structure. Contact openings 66 and 68 are then formed in alignment with the source 56 and the gate 52. Metal interconnection lines (not shown) are then formed to couple the source 56 and the gate 52 to the appropriate control lines. A passivating layer (not shown) may then be deposited on the wafer structure.

Still referring to FIG. 6, a photoresist is formed, and a buffered hydrofluoride (HF) wet etch is then used to form the cavity 20, which exposes the tip 18 and the inner surfaces of the grid 24, layer 22, and layer 64 that form the cavity 20. The remaining photoresist (not shown) is then stripped away and the bond pads are opened.

Figure 7:
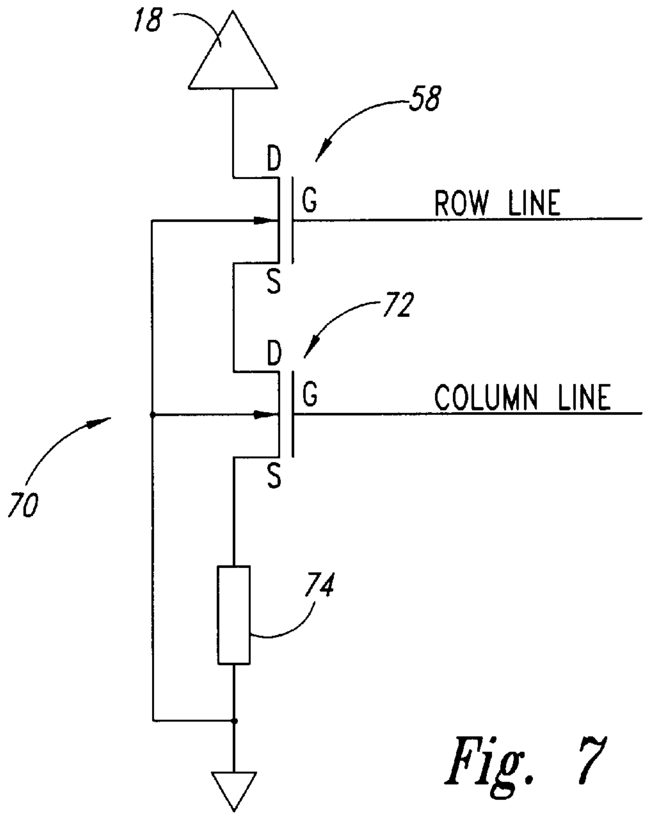
FIG. 7 is a circuit diagram of a cold-cathode select and drive circuit according to the present invention.

FIG. 7 is a schematic diagram of a cold-cathode select and drive circuit 70 according to the present invention. As shown, circuit 70 includes the high-voltage drive transistor 58, which has its drain D coupled to the tip 18, its gate G coupled to a row line, its substrate biased to ground, and a source S. The circuit 70 also includes the low voltage transistor 72, which has its drain D coupled to the source S of transistor 58, its gate G coupled to a column line, its substrate biased at ground, and a source S. In another aspect of the invention, the substrate is biased at a negative voltage. The circuit 70 also includes a current limiting impedance 74, such as a current limiting resistor, which is coupled between the source S of the transistor 72 and ground.

In operation, each tip 18 is located at the intersection of a particular row and a particular column. When both the row and column are selected, the tip 18 is activated. A voltage level on the row and the column line that is sufficient to turn on transistors 58 and 72, respectively, serves as a select signal. Thus, when both the row line and column line that are coupled to circuit 70 carry a select signal, both the transistors 58 and 72 are activated. The simultaneous activation of both transistors 58 and 72 allows a current to flow from the tip 18 through the transistors 58 and 72 and the impedance 74 to ground. The impedance 74 limits the current flowing through the tip 18 to a predetermined maximum value determined by the column signal coupled to the gate of the transistor 72.

Figure 8:
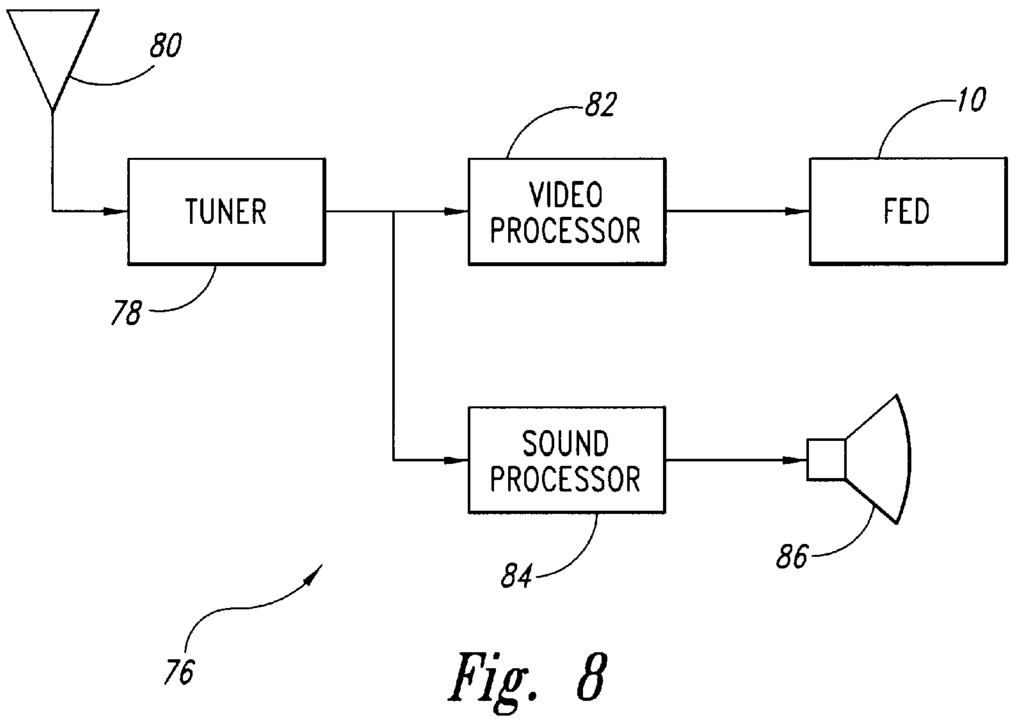
FIG. 8 is a video receiver and display device that incorporates the present invention.

FIG. 8 is a block diagram of a video receiver and display 76 that incorporates the present invention. Circuit 76 includes a conventional tuner 78 that receives one or more broadcast video signals from a conventional signal source such as an antenna 80. An operator (not shown) programs, or otherwise controls, the tuner 78 to select one of these broadcast signals and to output it as a video signal. The tuner 78 may generate the video signal at the same carrier frequency as the selected broadcast signal, at a baseband frequency, or at an intermediate frequency, depending upon the design of the circuit 76.

The tuner 78 couples the video signal to a conventional video processor 82 and a conventional sound processor 84. The sound processor 84 decodes the sound component of the video signal and provides this sound signal to a speaker 86, which converts the sound signal into audible tones. The video processor 82 decodes, or otherwise processes, the video component of the video signal and generates a display signal. The video processor 82 may generate the display signal as either a digital or an analog signal, depending upon the design of the circuit 76. The video processor 82 couples the display signal to the FED 10, which converts the display signal into a visible image.

In one aspect of the invention, the sound processor 84 and the speaker 86 are omitted such that the circuit 76 provides only a video image. Furthermore, although shown coupled to the antenna 80, the tuner 78 may receive broadcast signals from other conventional sources, such as a cable system, a satellite system, or a video cassette recorder (VCR). Alternatively, the tuner 78 may receive a non-broadcast video signal, such as from a closed circuit video system. In such a case where only one video signal is input to the circuit 76, the tuner 78 may be omitted and the video signal may be directly coupled to the inputs of the video processor 82 and the sound processor 84.

It will be appreciated that, although specific embodiments of the invention have been described herein for purposes of illustration, various modifications may be made without departing from the spirit and scope of the invention. Accordingly, the invention is not limited except as by the appended claims. For example, the high voltage n tank 16 may be formed after either or both the tip 18 and the field oxide 46. Additionally, although described as having field effect transistors, the FED 10 may incorporate bipolar transistors, where the high-voltage tank 16 forms the collector of the drive transistor 58.

What is claimed is:

1. A method of forming a cold cathode emission device, comprising:

forming a drain having a first conductivity and a first width in a substrate having a second conductivity;

removing a portion of the drain and the substrate to form an emitter tip that projects upwardly from the drain, the emitter tip further having a base with a second width, the base being integral with the drain, and the first width being greater than the second width to form a remaining portion that extends outwardly from the base of the emitter tip;

forming a source having a first conductivity in the substrate, the source being spaced apart from the remaining portion of the drain to form a channel region therebetween;

forming a gate insulator over the channel region, the gate insulator having a first end that at least partially overlays the remaining portion of the drain;

forming a gate over the gate insulator, the gate having a first end that overlays the first end of the gate insulator; and forming a field oxide isolation structure on the remaining portion of the drain, the field oxide structure being substantially adjacent to the emitter tip and abutting the first end of the gate insulator and the first end of the gate.

2. The method of claim 1 wherein the step of forming a gate further comprises forming a gate that at least partially overlays the field oxide isolation structure.

3. The method of claim 1 wherein the step of forming a gate insulator further comprises forming a gate insulator having a second end that at least partially overlays the source.

4. The method of claim 1 wherein the step of forming a gate further comprises forming a gate having a second end that at least partially overlays the second end of the gate insulator.

5. The method of claim 1 wherein the first conductivity is donor type; and the second conductivity is acceptor type.

6. The method of claim 1 wherein tie step of forming a drain is further comprised of forming a high-voltage drain.

7. The method of claim 1 wherein the step of removing a portion of the drain and the substrate to form an emitter tip further comprises forming a conical emitter tip.

8. A method of forming a cold cathode emission device, comprising:

implanting a dopant of a first conductivity into a substrate having a second conductivity to form a high voltage tank;

removing a portion of the tank and the substrate to form an emitter tip that projects outwardly from the tank with a base integral with the tank, and a remaining portion that extends outwardly from the base of the emitter tip;

implanting a dopant of the first conductivity in the substrate to form a source that is spaced apart from the remaining portion of the tank to form a channel region therebetween;

forming a gate insulator with opposing ends that extends over the channel region and at least partially overlays the remaining portion of the tank at one end, and at least partially overlays the source at the opposing end;

forming a gate that extends substantially over the gate insulator; and forming a field oxide isolation structure on the remaining portion of the tank, the field oxide structure being substantially adjacent to the emitter tip and abuting the first end of the gate insulator and the first end of the gate.

9. The method of claim 8 wherein the step of forming a gate further comprises forming a gate that at least partially overlays the field oxide isolation structure.

10. The method of claim 8 wherein the step of removing a portion of the tank and the substrate to form an emitter tip further comprises etching a conical emitter tip.

11. The method of claim 8 wherein the first conductivity is donor type; and the second conductivity is acceptor type.

12. A method of forming a cold cathode emission device, comprising:

forming an electron receiver of a first conductivity into a substrate having a second conductivity;

forming an electron supplier of the first conductivity in the substrate, the electron supplier being spaced apart from the electron receiver;

forming a control region in the substrate between and contiguous with the electron receiver and the electron supplier;

removing a portion of the electron receiver and the substrate to form an emitter tip that extends upwardly from the electron receiver and having a base that is integral with the receiver and further having a remaining portion of the electron receiver that extends outwardly from the base of the emitter tip;

depositing a gate insulator over the channel region and at least partially onto the remaining portion of the electron receiver and the electron supplier, depositing a gate substantially over the gate insulator; and depositing a field oxide isolation structure on the remaining portion of the electron receiver, the field oxide structure being positioned substantially adjacent to the emitter tip and butting the ends of the gate insulator and the gate.

13. The method of claim 12 wherein the step of depositing a gate further comprises depositing a gate that at least partially overlays the field oxide isolation structure.

14. The method of claim 12 wherein the step of forming an electron receiver further comprises forming a high-voltage tank.

15. The method of claim 12 wherein the step of removing a portion of the electron receiver and the substrate to form an emitter tip further comprises etching a conical emitter tip.

16. The method of claim 12 wherein the first conductivity is donor type; and the second conductivity is acceptor type.

17. The method of claim 12 wherein the step of forming an electron receiver further comprises forming the drain of a drive transistor.

18. The method of claim 17 wherein the step of forming an electron supplier further comprises forming the source of a drive transistor.

19. The method of claim 18 wherein the step of forming a control region further comprises forming a channel region of a drive transistor.

* * * * *

UNITED STATES PATENT AND TRADEMARK OFFICE
CERTIFICATE OF CORRECTION

PATENT NO. : 6,372,530 B1
DATED : April 16, 2002
INVENTOR(S) : John K. Lee

It is certified that error appears in the above-identified patent and that said Letters Patent is hereby corrected as shown below:

Title page,
Item [57], ABSTRACT,
Line 3, reads "fast" should read -- first --
Line 7, reads "s" should read -- first --

Column 6,
Line 59, reads "tie" should read -- the --

Column 7,
Line 18, reads "abuting" should read -- abutting --

Column 8,
Line 9, reads "supplies," should read -- supplies; --
Line 14, reads "butting" should read -- abutting --

Signed and Sealed this

Twenty-ninth Day of October, 2002

*Attest:*

JAMES E. ROGAN

*Attesting Officer*

*Director of the United States Patent and Trademark Office*